(12) United States Patent
Horng

(10) Patent No.: US 9,243,642 B2
(45) Date of Patent: Jan. 26, 2016

(54) COOLING SYSTEM FOR USE IN A PORTABLE COMMUNICATION DEVICE

(71) Applicant: Sunonwealth Electric Machine Industry Co., Ltd., Kaohsiung (TW)

(72) Inventor: Alex Horng, Kaohsiung (TW)

(73) Assignee: SUNONWEALTH ELECTRIC MACHINE INDUSTRY CO., LTD, Kaohsiung (TW)

( * ) Notice: Subject to any disclaimer, the term of this patent is extended or adjusted under 35 U.S.C. 154(b) by 414 days.

(21) Appl. No.: 13/717,014

(22) Filed: Dec. 17, 2012

(65) Prior Publication Data

US 2013/0287595 A1      Oct. 31, 2013

(30) Foreign Application Priority Data

Apr. 25, 2012   (TW) .............................. 101114740 A

(51) Int. Cl.
*F04D 15/00*   (2006.01)
*F04D 27/00*   (2006.01)
*F04D 25/08*   (2006.01)
*F04B 49/06*   (2006.01)
*F04B 49/20*   (2006.01)
*F01P 5/04*    (2006.01)
(Continued)

(52) U.S. Cl.
CPC ............ *F04D 15/0066* (2013.01); *F04B 19/20* (2013.01); *F04B 49/065* (2013.01); *F04D 25/08* (2013.01); *F04D 27/004* (2013.01); *F01P 2005/046* (2013.01); *H05K 7/20209* (2013.01)

(58) Field of Classification Search
CPC .... F04B 49/065; F04B 49/20; F04D 15/0066; F04D 27/004; F04D 25/08; H05K 7/20209; F01P 2005/046

USPC .............................. 417/14, 32, 42, 44 A, 44.1
See application file for complete search history.

(56) References Cited

U.S. PATENT DOCUMENTS 5,511,513 A  *  4/1996  Baron ................. A01K 1/0107
                                                   119/163
6,972,959 B2    12/2005  Asai et al.
(Continued)

FOREIGN PATENT DOCUMENTS

CN      1534436 A      10/2004
TW      I307261        3/2009
(Continued)

*Primary Examiner* — Justin Jonaitis
*Assistant Examiner* — Christopher Brunjes
(74) *Attorney, Agent, or Firm* — Muncy, Geissler, Olds & Lowe, P.C.

(57) ABSTRACT

A cooling system for use in a portable communication device includes a detection module, a cooling module and a central control module. The detection module detects whether the portable communication device is in a communication state and generates an acknowledgement signal. The cooling module includes a fan and a driving unit. The central control module is electrically coupled to the detection module and the driving unit, detects an operational temperature of said device, and generates a detected temperature value corresponding to the detected operational temperature. The central control module controls the fan to operate in a silent mode or a cooling mode. The central control module controls the fan to operate in the silent mode if the central control module receives the acknowledgement signal when the detected temperature value is smaller than a temperature threshold value, else the central control module controls the fan to operate in the cooling mode.

2 Claims, 2 Drawing Sheets

(51) Int. Cl.
*H05K 7/20* (2006.01)
*F04B 19/20* (2006.01)

(56) References Cited

U.S. PATENT DOCUMENTS

| | | | |
|---|---|---|---|
| 7,841,837 B2 * | 11/2010 | Chen | H05K 7/20209 307/139 |
| 2003/0201741 A1 * | 10/2003 | Lee | 318/268 |
| 2009/0167228 A1 * | 7/2009 | Chung | G05D 23/1917 318/455 |
| 2012/0107139 A1 * | 5/2012 | Naitou | G03B 21/16 417/44.1 |

FOREIGN PATENT DOCUMENTS

| | | |
|---|---|---|
| TW | I307763 B | 3/2009 |
| TW | 201109914 A1 | 3/2011 |
| TW | M410240 U1 | 8/2011 |
| TW | I415556 B | 11/2013 |

* cited by examiner

COOLING SYSTEM FOR USE IN A PORTABLE COMMUNICATION DEVICE

BACKGROUND OF THE INVENTION

1. Field of the Invention

The present invention generally relates to a cooling system for use in a portable communication device and, more particularly, to a cooling system that is installed in a portable communication device for expelling the heat from the interior of the portable communication device when the temperature of the portable communication device increases, ensuring the performance of the portable communication device.

2. Description of the Related Art

Modern portable communication devices with mobile communication functions, such as cellular phones, Personal Digital Assistants (PDA) or the like, often overheat due to waste heat generated during the operation thereof. This results in breakdown of the portable communication devices. To solve the problem, a cooling system is installed somewhere in the portable communication device where heat is generated, so as to prevent the portable communication device from overheating.

Taiwan Patent No. I307261 discloses a conventional cooling system for use in a portable communication device such as a cellular phone or a PDA. The cooling system includes an air-guiding module having at least one fan adapted to cool down the portable communication device, ensuring normal operation of the portable communication device.

In the above patent, the cooling system provides improved cooling effect for the portable communication device, preventing the portable communication device from overheating. Since the portable communication device has a call function, a user often holds the portable communication device somewhere by his/her ear when using the portable communication device to converse with another one. In this regard, the noise generated by the fan of the cooling system may interfere with the user's conversation. The noise may disturb the ability of the user to hear clearly or even disturb the remote user on the call. As a result, the call quality is affected. In addition, a great deal of heat is generated when the portable communication device operates in a long duration of time. Thus, it has been an important subject to provide satisfactory call quality as well as required cooling effect.

SUMMARY OF THE INVENTION

It is therefore the objective of this invention to provide a cooling system for use in a portable communication device wherein the cooling system is capable of stopping the fan of the portable communication device or capable of controlling the fan to rotate in a slower speed when the portable communication device operates in a communication state with lower operational temperature. Thus, satisfactory communication quality of the portable communication device is maintained while the required cooling effect is provided for the portable communication device.

One embodiment of the invention discloses a cooling system for use in a portable communication device, which includes a detection module, a cooling module and a central control module. The detection module detects whether the portable communication device is in a communication state and generates an acknowledgement signal when the portable communication device is in the communication state. The cooling module includes a fan and a driving unit electrically coupled to the fan. The central control module is electrically coupled to the detection module and the driving unit, detects an operational temperature of the portable communication device, and generates a detected temperature value corresponding to the detected operational temperature. The central control module controls the fan to operate in a silent mode or a cooling mode. The central control module controls the fan to operate in the silent mode if the central control module receives the acknowledgement signal when the detected temperature value is smaller than a temperature threshold value, else the central control module controls the fan to operate in the cooling mode.

In a preferred form shown, the fan rotates in a speed faster than a reference rotational speed when the fan operates in the cooling mode. In addition, the fan stops or rotates in a speed slower than the reference rotational speed when the fan operates in the silent mode.

In the preferred form shown, the central control module comprises a temperature detection unit and an operation unit. The temperature detection unit detects the operational temperature of the portable communication device in real time and correspondingly generates the detected temperature value. The operation unit is electrically coupled to the detection module, the driving unit and the temperature detection unit. The operation unit sets a temperature threshold value and the reference rotational speed. The operation unit controls the fan to operate in the silent mode if the operation unit receives the acknowledgement signal when the detected temperature value is smaller than the temperature threshold value, else the operation unit controls the fan to operate in the cooling mode.

In the preferred form shown, the operation unit further sets an activation temperature value which is smaller than the temperature threshold value. The operation unit stops the fan if the operation unit receives the acknowledgement signal when the detected temperature value is not larger than the activation temperature value. The operation unit controls the fan to rotate in the speed slower than the reference rotational speed if the operation unit receives the acknowledgement signal when the detected temperature value is larger than the activation temperature value but smaller than the temperature threshold value.

In the preferred form shown, the operation unit further sets an accumulated time length and a time threshold value. The operation unit starts to calculate an accumulated amount of time during which the acknowledgement signal has been constantly received. The operation unit stops calculating the accumulated amount of time when the detected temperature value has reached the temperature threshold value. The length of time calculated by the operation unit is taken as the accumulated time length. The operation unit stops the fan when the accumulated time length is larger than zero but has not yet reached the time threshold value. The operation unit controls the fan to rotate in the speed slower than the reference rotational speed when the accumulated time length has reached the time threshold value.

In the preferred form shown, the detection module is a distance sensor measuring a distance between the detection module and a neighboring object and converting the distance into a detected distance value. The acknowledgement signal specifies information regarding the detected distance value between the detection module and the neighboring object. The operation unit further sets a distance threshold value. The operation unit stops the fan if the operation unit receives the acknowledgement signal when the detected temperature value is smaller than the temperature threshold value and the detected distance value is smaller than the distance threshold value. The operation unit controls the fan to rotate in the speed slower than the reference rotational speed if the operation unit receives the acknowledgement signal when the detected temperature value is smaller than the temperature threshold value and the detected distance value is not smaller than the distance threshold value.

In another preferred form shown, the driving unit controls the fan to operate in the cooling mode when the driving unit does not receive the acknowledgement signal from the central control module. The central control module comprises a temperature detection unit, an operation unit and a switch. The temperature detection unit detects the operational temperature of the portable communication device in real time and correspondingly generates the detected temperature value. The operation unit is electrically coupled to the detection module. The operation unit outputs a silent mode signal when the operation unit receives the acknowledgement signal from the detection module. The switch is electrically coupled to the temperature detection unit, the operation unit and the driving unit, so as to receive the detected temperature value and the silent mode signal. The switch sends the silent mode signal to the driving unit if the switch receives the silent mode signal when the detected temperature value is smaller than a temperature threshold value, so as to control the fan to operate in the silent mode.

In the preferred form shown, the operation unit further sets an accumulated time length and a time threshold value. The operation unit starts to calculate an accumulated amount of time during which the acknowledgement signal has been constantly received. The accumulated amount of time calculated by the operation unit is taken as the accumulated time length. The operation unit outputs the silent mode signal to stop the fan when the accumulated time length has not yet reached the time threshold value, and outputs the silent mode signal to control the fan to rotate in the speed slower than the reference rotational speed when the accumulated time length has reached the time threshold value.

In the preferred form shown, the detection module is a distance sensor measuring a distance between the detection module and a neighboring object and converting the distance into a detected distance value. The acknowledgement signal specifies information regarding the detected distance value between the detection module and the neighboring object. The operation unit further sets a distance threshold value. The operation unit outputs the silent mode signal to stop the fan when the detected distance value is smaller than the distance threshold value, and outputs the silent mode signal to control the fan to rotate in the speed slower than the reference rotational speed when the detected distance value is not smaller than the distance threshold value.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
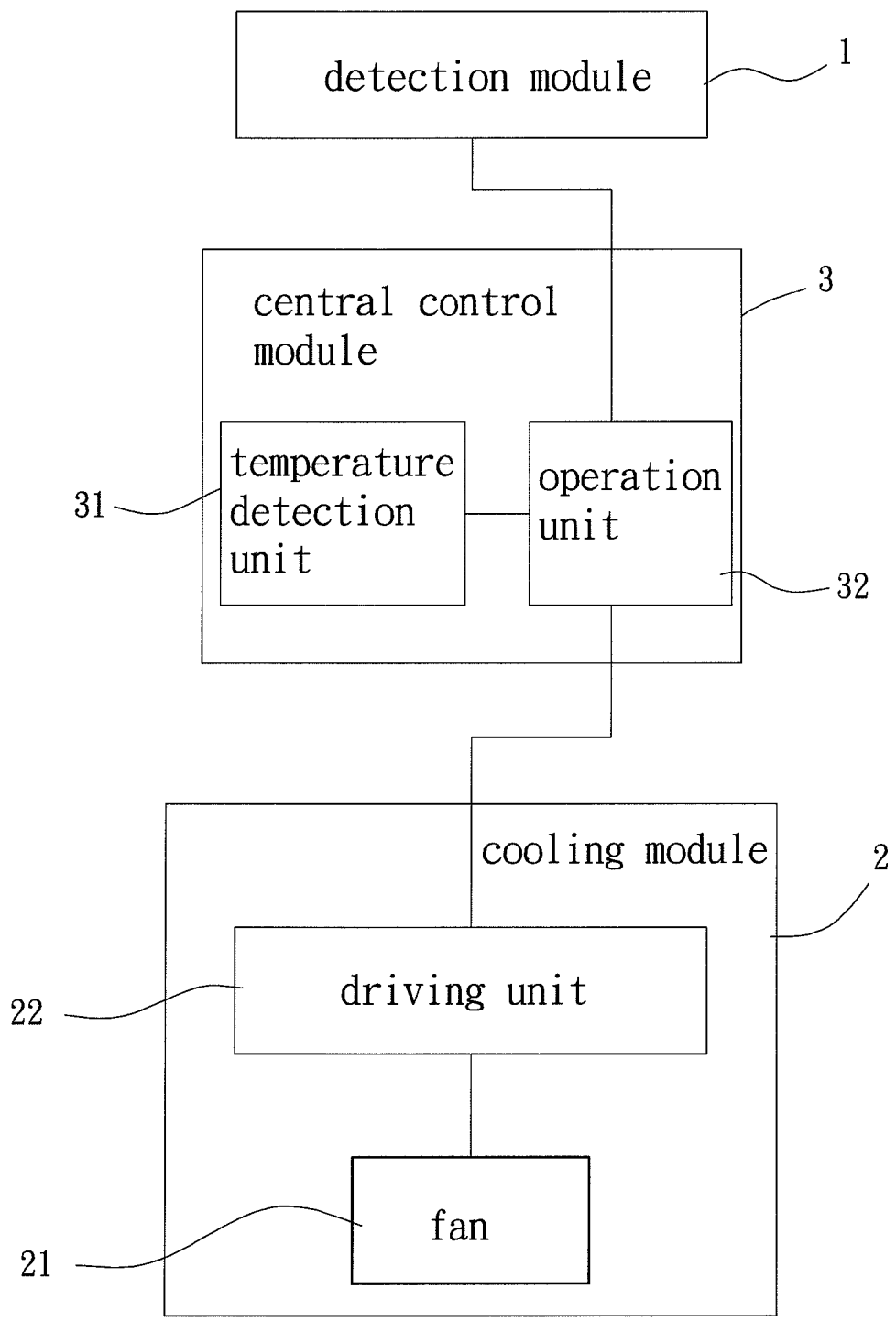
FIG. 1 shows a block diagram of a cooling system for use in a portable communication device according to a first embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

FIG. 1 shows a block diagram of a cooling system for use in a portable communication device according to a first embodiment of the invention. The cooling system includes a detection module 1, a cooling module 2 and a central control module 3. The detection module 1 is electrically coupled to the central control module 3. The cooling module 2 is electrically coupled to the central control module 3. The detection module 1 and the cooling module 2 may communicate with the central control module 3 through wired or wireless technology.

The detection module 1 detects whether a portable communication device, such as a cellular phone, a PDA, a tablet computer or the like, is in a communication state. When the detection module 1 detects that the portable communication device is in the communication state, the detection module 1 sends an acknowledgement signal to the central control module 3. When the detection module 1 detects that the portable communication device is not in the communication state, the detection module 1 does not send any signal to the central control module 3 or sends a non-acknowledgement signal to the central control module 3. The portable communication device may be transmitting or receiving information such as audio data, vocal data, text messages or photos when the portable communication device is in the communication state. As an example, the portable communication device is in the communication state when a user is conversing with another one through the portable communication device or transmitting/receiving text messages or photos through the portable communication device.

The cooling module 2 includes a fan 21 and a driving unit 22. The fan 21 may be an advection fan capable of driving air to flow in a direction perpendicular to the axial direction of the fan, an axial fan or a blower fan. Thus, the fan 21 will effectively cool down the heat sources generated during the operations of the portable communication device. The driving unit 22 is electrically coupled to the central control module 3 and the fan 21. The driving unit 22 activates or stops the fan 21 based on the instructions of the central control module 3. The driving unit 22 may be mounted inside or outside of the fan 21.

The central control module 3 activates or stops the fan 21 via the driving unit 22 of the cooling module 2 according to the operational temperature of the portable communication device and the signal received from the detection module 1. The central control module 3 includes a temperature detection unit 31 and an operation unit 32. The temperature detection unit 31 detects the operational temperature of the portable communication device in real time and generates a detected temperature value corresponding to the detected operational temperature. The temperature detection unit 31 is preferably a thermister which generates a voltage value or a current value corresponding to the detected operational temperature. The voltage value or current value is taken as the detected temperature value. The operation unit 32 is electrically connected to the detection module 1, the driving unit 22 and the temperature detection unit 31. The operation unit 32 sets a reference rotational speed. The operation unit 32 controls the fan 21 to operate in a cooling mode or a silent mode via the driving unit 22. The fan 21 rotates in a speed faster than the reference rotational speed when the fan 21 is in the cooling mode. In another aspect, the fan 21 rotates in a speed slower than the reference rotational speed when the fan 21 is in the silent mode. Specifically, the operation unit 32 of the cooling system sets a temperature threshold value. The operation unit 32 controls the fan 21 to operate in the cooling mode when the operation unit 32 does not receive the acknowledgement signal from the detection module 1. If the operation unit 32 receives the acknowledgement signal when the detected temperature value is smaller than the temperature threshold value, the operation unit 32 controls the fan 21 to operate in the silent mode. In another case scenario, if the operation unit 32 receives the acknowledgement signal when the detected temperature value is not smaller than the temperature threshold value, the operation unit 32 still controls the fan 21 to operate in the cooling mode. Table 1 below shows individual operation modes of the fan 21 under different conditions according to the first embodiment.

TABLE 1

Operation Modes of The Fan

| Acknowledgement Signal Is Received? | The Detected Temperature Is Smaller Than The Temperature Threshold Value? | Operation Mode of The Fan |
|---|---|---|
| No | Don't Care | Cooling Mode |
| Yes | Yes | Silent Mode |
| Yes | No | Cooling Mode |

Furthermore, when the fan 21 operates in the silent mode, the cooling system of the first embodiment may have a variety of modifications, as described below.

In the first modification, the operation unit 32 of the central control module 3 further sets an accumulated time length and a time threshold value. If the operation unit 32 receives the acknowledgement signal when the detected temperature value of said device is smaller than the temperature threshold value, the operation unit 32 starts to calculate the accumulated amount of time during which the acknowledgement signal has been constantly received. The calculation of time is carried out only when the detected temperature value of said device is smaller than the temperature threshold value. Namely, the operation unit 32 stops calculating the accumulated amount of time when the detected temperature value has reached the temperature threshold value. The accumulated amount of time is taken as the accumulated time length. As the amount of time is constantly being accumulated and calculated, the operation unit 32 determines whether the accumulated time length (i.e. the instantly accumulated amount of time) has reached the time threshold value, so as to determine which manner the fan 21 should be operated under the silent mode. Specifically, once the operation unit 32 receives the acknowledgement signal, the operation unit 32 immediately suspends the fan 21 and starts to calculate the accumulated amount of time during which the acknowledgement signal has been constantly received (note the calculation of time is carried out only when the detected temperature value of said device is smaller than the temperature threshold value, as stated above). In this stage, once the accumulated time length (i.e. the instantly accumulated amount of time) has reached the time threshold value, the operation unit 32 immediately re-starts and controls the fan 21 to rotate in a speed slower than the reference rotational speed. In the first modification described above, although the fan 21 will stop expelling the heat from the portable communication device due to the suspension of the fan 21 if the operation unit 32 receives the acknowledgement signal when the detected temperature value of said device is smaller than the temperature threshold value, the fan 21 can be re-started by the operation unit 32 to rotate in a slower speed with low noise once the accumulated time length (i.e. the instantly accumulated amount of time) has reached the time threshold value. Thus, the cooling operation of the portable communication device is resumed after the fan 21 is stopped for a period of time. This ensures satisfactory communication quality of the portable communication device while providing said device with required cooling effect. The following Table 2 shows individual operation modes of the fan 21 under different conditions according to the first modification of the first embodiment.

TABLE 2

Operation Modes of The Fan

| Acknowledgement Signal Is Received? | The Detected Temperature Is Smaller Than The Temperature Threshold Value? | The Accumulated Time Length Has Reached The Time Threshold Value? | Operation Mode of The Fan |
|---|---|---|---|
| No | Don't Care | Don't Care | Cooling Mode |
| Yes | Yes | No | Silent Mode (Suspension) |
| Yes | Yes | Yes | Silent Mode (Low Speed) |
| Yes | No | Don't Care | Cooling Mode |

In the second modification, the operation unit 32 of the central control module 3 further sets an activation temperature value which is smaller than the temperature threshold value. The operation unit 32 determines whether the detected temperature value is larger than the activation temperature value, so as to determine which manner the fan 21 should be operated under the silent mode. Specifically, in this modification, if the operation unit 32 receives the acknowledgement signal when the detected temperature value is not larger than the activation temperature value, the operation unit 32 suspends the fan 21. In another aspect, if the detected temperature value is larger than the activation temperature value but smaller than the temperature threshold value, the operation unit 32 controls the fan 21 to rotate in a speed slower than the reference rotational speed. In this manner, if the operation unit 32 receives the acknowledgement signal (i.e. the portable communication device is in the communication state) when the detected temperature value is larger than the activation temperature value but smaller than the temperature threshold value, the central control module 3 controls the fan 21 to rotate in a slower speed with low noise. This ensures satisfactory communication quality of the portable communication device while providing said device with required cooling effect. The following Table 3 shows individual operation modes of the fan 21 under different conditions according to the second modification of the first embodiment.

TABLE 3

Operation Modes of The Fan

| Acknowledgement Signal Is Received? | The Detected Temperature Is Larger Than The Activation Temperature Value? | The Detected Temperature Is Smaller Than The Temperature Threshold Value? | Operation Mode of The Fan |
|---|---|---|---|
| No | Don't Care | Don't Care | Cooling Mode |
| Yes | No | Yes | Silent Mode (Suspension) |
| Yes | Yes | Yes | Silent Mode (Low Speed) |
| Yes | Yes | No | Cooling Mode |

In the third modification, the detection module 1 may be a distance sensor capable of measuring the distance between the detection module 1 and a neighboring object, such as an infrared detection module. The detection module 1 then converts the distance between the detection module 1 and the neighboring object into a detected distance value. Therefore, it can be determined whether the portable communication device is in the communication state based on whether there are any objects that are detected by the detection module 1. Herein, the neighboring object refers to the user operating the portable communication device, and the acknowledgement signal specifies information regarding the detected distance value between the detection module 1 and the user. The operation unit 32 further sets a distance threshold value. The operation unit 32 determines whether the detected distance value specified in the acknowledgement signal is smaller than the distance threshold value, so as to determine which manner the fan 21 should be operated under the silent mode. Specifically, in this modification, if the operation unit 32 receives the acknowledgement signal when the detected temperature value is smaller than the temperature threshold value and when the detected distance value specified in the acknowledgement signal is smaller than the distance threshold value, the operation unit 32 suspends the fan 21. In another aspect, if the operation unit 32 receives the acknowledgement signal when the detected temperature value is smaller than the temperature threshold value and when the detected distance value specified in the acknowledgement signal is not smaller than the distance threshold value, the operation unit 32 controls the fan 21 to rotate in a speed slower than the reference rotational speed. In this manner, if the operation unit 32 receives the acknowledgement signal when the detected temperature value is smaller than the temperature threshold value, the central control module 3 may control the fan 21 to rotate in a slower speed with low noise once the detection module 1 detects that the distance between the detection module 1 and the user has reached a proper value not smaller than the distance threshold value. This ensures satisfactory communication quality of the portable communication device while providing said device with required cooling effect. The following Table 4 shows individual operation modes of the fan 21 under different conditions according to the third modification of the first embodiment.

TABLE 4

Operation Modes of The Fan

| Acknowledgement Signal Is Received? | The Detected Temperature Is Smaller Than The Temperature Threshold Value? | The Detected Distance Value Is Smaller Than The Distance Threshold Value? | Operation Mode of The Fan |
|---|---|---|---|
| No | Don't Care | Don't Care | Cooling Mode |
| Yes | Yes | Yes | Silent Mode (Suspension) |
| Yes | Yes | No | Silent Mode (Low Speed) |
| Yes | No | Don't Care | Cooling Mode |

Figure 2:
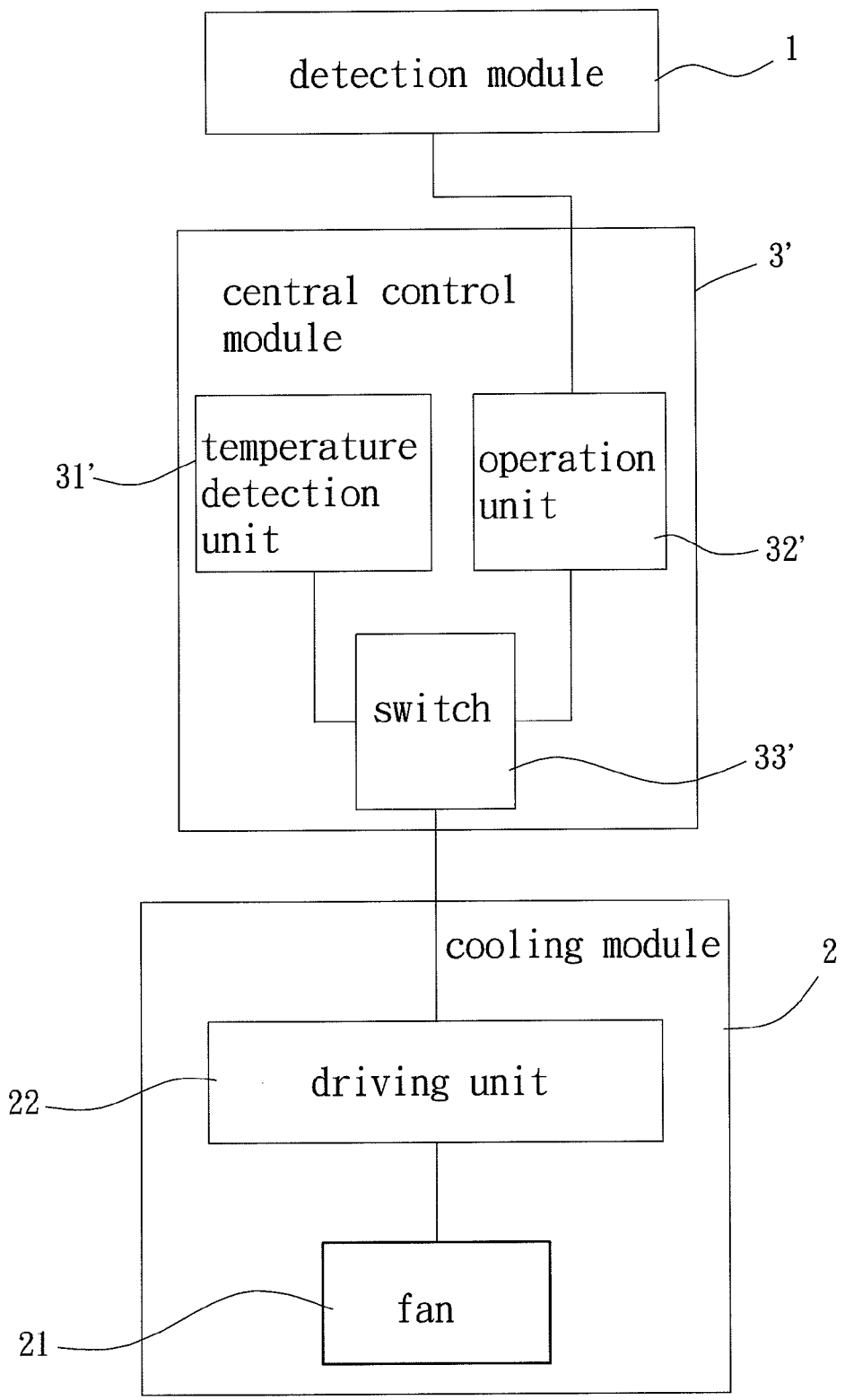
FIG. 2 shows a block diagram of a cooling system for use in a portable communication device according to a second embodiment of the invention.

FIG. 2 shows a block diagram of a cooling system for use in a portable communication device according to a second embodiment of the invention. The central control module 3 in the first embodiment is replaced with a central control module 3' in this embodiment. The driving unit 22 controls the fan 21 to operate in the cooling mode when the driving unit 22 does not receive the acknowledgement signal from the central control module 3'. The central control module 3' includes a temperature detection unit 31', an operation unit 32' and a switch 33'. The temperature detection unit 31' detects the operational temperature of the portable communication device and generates a detected temperature value corresponding to the operational temperature. The operation unit 32' is electrically connected to the detection module 1. The operation unit 32' outputs a silent mode signal when the operation unit 32' receives the acknowledgement signal from the detection module 1. The switch 33' is electrically connected to the temperature detection unit 31', the operation unit 32' and the driving unit 22, so as to receive the detected temperature value and the silent mode signal. If the switch 33' receives the silent mode signal when the detected temperature value is smaller than a temperature threshold value, and the switch 33' sends the silent mode signal to the driving unit 22, controlling the fan 21 to operate in the silent mode.

Based on the above circuit structure, if the operation unit 32' does not receive the acknowledgement signal from the detection module 1, the switch 33' does not generate any signal. In this case, the driving unit 22 controls the fan 21 to operate in the cooling mode. In another aspect, if the operation unit 32' receives the acknowledgement signal when the detected temperature value is not smaller than the temperature threshold value, the switch 33' still does not generate any signal. In this case, the fan 21 still rotates in the cooling mode. In another aspect, if the operation unit 32' receives the acknowledgement signal when the detected temperature value is smaller than the temperature threshold value, the switch 33' sends the silent mode signal to the driving unit 22. In response, the driving unit 22 switches the fan 21 from the cooling mode to the silent mode. Furthermore, the operation unit 32' may also set the accumulated time length and the time threshold value as previously described in the first modification of the first embodiment above. Moreover, the operation unit 32' may also set the distance threshold value as previously described in the third modification of the first embodiment above.

In summary, the cooling system of the invention can be applied to a variety of portable communication devices. In this regard, when the central control module 3 receives the acknowledgement signal from the detection module 1, the central control module 3 controls the fan 21 to operate in the cooling mode or the silent mode when the portable communication device is in the communication state. The central control module 3 may even stop the fan 21 or control the fan 21 to rotate in a speed slower than the reference rotational speed when the fan 21 is in the silent mode. This will ensure satisfactory communication quality of the portable communication device while providing said device with required cooling effect.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A cooling system for use in a portable communication device, comprising:
    a detection module detecting whether the portable communication device is in a communication state and generating an acknowledgement signal when the portable communication device is in the communication state;
    a cooling module comprising a fan and a driving unit electrically coupled to the fan; and
    a central control module electrically coupled to the detection module and the driving unit, detecting an operational temperature of the portable communication device, and generating a detected temperature value corresponding to the detected operational temperature, wherein the central control module controls the fan to operate in a silent mode or a cooling mode, and wherein the central control module controls the fan to operate in the silent mode if the central control module receives the acknowledgement signal when the detected temperature value is smaller than a temperature threshold value, else the central control module controls the fan to operate in the cooling mode, wherein the fan rotates at a speed faster than a reference rotational speed when the fan operates in the cooling mode, and wherein the fan stops or rotates at a speed slower than the reference rotational speed when the fan operates in the silent mode, wherein the central control module comprises a temperature detection unit and an operation unit, wherein the temperature detection unit detects the operational temperature of the portable communication device in real time and correspondingly generates the detected temperature value, wherein the operation unit is electrically coupled to the detection module, the driving unit and the temperature detection unit, wherein the operation unit sets the temperature threshold value and the reference rotational speed, wherein the operation unit controls the fan to operate in the silent mode if the operation unit receives the acknowledgement signal when the detected temperature value is smaller than the temperature threshold value, else the operation unit controls the fan to operate in the cooling mode, wherein the operation unit further sets an accumulated time length and a time threshold value, wherein the operation unit starts to calculate an accumulated amount of time during which the acknowledgement signal has been constantly received, wherein the operation unit stops calculating the accumulated amount of time when the detected temperature value has reached the temperature threshold value, wherein the accumulated amount of time calculated by the operation unit is taken as the accumulated time length, wherein the operation unit stops the fan when the accumulated time length is larger than zero but has not yet reached the time threshold value, and wherein the operation unit controls the fan to rotate at the speed slower than the reference rotational speed when the accumulated time length has reached the time threshold value.

2. A cooling system for use in a portable communication device, comprising:

a detection module detecting whether the portable communication device is in a communication state and generating an acknowledgement signal when the portable communication device is in the communication state;

a cooling module comprising a fan and a driving unit electrically coupled to the fan; and a central control module electrically coupled to the detection module and the driving unit, detecting an operational temperature of the portable communication device, and generating a detected temperature value corresponding to the detected operational temperature, wherein the central control module controls the fan to operate in a silent mode or a cooling mode, and wherein the central control module controls the fan to operate in the silent mode if the central control module receives the acknowledgement signal when the detected temperature value is smaller than a temperature threshold value, else the central control module controls the fan to operate in the cooling mode, wherein the fan rotates at a speed faster than a reference rotational speed when the fan operates in the cooling mode, and wherein the fan stops or rotates at a speed slower than the reference rotational speed when the fan operates in the silent mode, wherein the driving unit controls the fan to operate in the cooling mode when the driving unit does not receive the acknowledgement signal from the central control module, wherein the central control module comprises a temperature detection unit, an operation unit and a switch, wherein the temperature detection unit detects the operational temperature of the portable communication device in real time and correspondingly generates the detected temperature value, wherein the operation unit is electrically coupled to the detection module, wherein the operation unit outputs a silent mode signal when the operation unit receives the acknowledgement signal from the detection module, wherein the switch is electrically coupled to the temperature detection unit, the operation unit and the driving unit, so as to receive the detected temperature value and the silent mode signal, wherein the switch sends the silent mode signal to the driving unit if the switch receives the silent mode signal when the detected temperature value is smaller than the temperature threshold value, so as to control the fan to operate in the silent mode, wherein the operation unit further sets an accumulated time length and a time threshold value, wherein the operation unit starts to calculate an accumulated amount of time during which the acknowledgement signal has been constantly received, wherein the accumulated amount of time calculated by the operation unit is taken as the accumulated time length, wherein the operation unit outputs the silent mode signal to stop the fan when the accumulated time length has not yet reached the time threshold value, and wherein the operation unit outputs the silent mode signal to control the fan to rotate at the speed slower than the reference rotational speed when the accumulated time length has reached the time threshold value.

* * * * *